US006580783B1

(12) United States Patent
Swale (10) Patent No.: US 6,580,783 B1
(45) Date of Patent: *Jun. 17, 2003

(54) 2ND LEVEL POWER FAULT TESTING APPARATUS FOR TESTING TELECOMMUNICATIONS EQUIPMENT

(75) Inventor: Gary L. Swale, Sebastapol, CA (US)

(73) Assignee: Alcatel, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/106,179

(22) Filed: Mar. 26, 2002

(65) Prior Publication Data (65)

Related U.S. Application Data (63) Continuation-in-part of application No. 09/753,885, filed on Jan. 3, 2001, now Pat. No. 6,519,321.

(51) Int. Cl.[7] .............................................. H04M 1/24
(52) U.S. Cl. ...................... 379/26.01; 379/27.05; 379/27.06; 379/29.03; 379/29.05; 379/412; 324/416; 324/522; 324/547
(58) Field of Search ....................... 379/26.01, 27.05, 379/27.06, 29.03, 29.05, 412, 15.01; 324/506, 509, 500, 511, 525, 416, 522, 547; 323/276; 361/111, 18, 43, 117, 118, 119, 56

(56) References Cited

U.S. PATENT DOCUMENTS

| 4,433,326 | A | * | 2/1984 | Howell | 340/310.07 |
|---|---|---|---|---|---|
| 4,785,373 | A | * | 11/1988 | Dash | 361/235 |
| 4,825,458 | A | * | 4/1989 | Dash | 379/15.05 |
| 5,671,110 | A | * | 9/1997 | McCartney et al. | 361/42 |
| 5,815,356 | A | * | 9/1998 | Rodriguez et al. | 361/91.6 |
| 6,061,445 | A | * | 5/2000 | Rahamim et al. | 379/412 |
| 6,417,762 | B1 | * | 7/2002 | Comer | 340/310.01 |
| 6,442,239 | B1 | * | 8/2002 | Abdo et al. | 379/26.01 |
| 6,456,088 | B1 | * | 9/2002 | Swale | 324/525 |

* cited by examiner

Primary Examiner—Curtis Kuntz
Assistant Examiner—Barry W Taylor
(74) Attorney, Agent, or Firm—Dananraj & Youst, P.C.; Richard A. Mysliwiec; V. Lawrence Sewell (57) ABSTRACT

A power fault testing apparatus for testing telecommunications equipment interfaces to Telcordia's $2^{nd}$ Level AC power fault standards. The apparatus is powered by a three-phase 480 VAC, 600 A power service. A plurality of transformers, including a variable autotransformer and a fixed transformer, and load resistor banks are coupled to the power source in a network organized as a plurality of selectable and switchable power paths for interfacing with an Equipment Under Test (EUT) operable to be disposed in a test chamber. Power output of the fixed transformer is referenced to a single point ground positioned at a relay bank. The power to the EUT is referenced to building ground that is tied to the single point ground of the fixed transformer. The fixed transformer thereby operates as an isolation transformer, which allows for testing the EUT while operating under power.

31 Claims, 6 Drawing Sheets

$2^{ND}$ LEVEL POWER FAULT TESTING APPARATUS FOR TESTING TELECOMMUNICATIONS EQUIPMENT

CROSS-REFERENCE TO RELATED APPLICATION

This application is a continuation-in-part of the following patent application: "$2^{nd}$ Level Power Fault Testing Apparatus For Testing Telecommunications Equipment," filed Jan. 3, 2001, Ser. No. 09/753,885, now U.S. Pat. No. 6,519,021 in the name of Gary L. Swale, which is hereby incorporated by reference for all purposes.

BACKGROUND OF THE INVENTION

The present invention relates to testing equipment for telecommunications equipment. More particularly, and not by way of any limitation, the present invention is directed to an AC power fault machine capable of testing telecommunications (telecom) line cards and broadband coaxial cable interfaces to known power fault immunity criteria.

DESCRIPTION OF RELATED ART

Telecommunications (telecom) equipment deployed in today's networks is required to comply with various governmental and industry standards not only to ensure seamless interoperability which reduces the risk of service interruption resulting from third-party product failures, but also to address various product safety issues. Accordingly, equipment manufacturers test their products to telecom industry standards commonly known as Telcordia specifications (formerly known as the BellCore specifications) which define an extensive list of electromagnetic compliance (EMC), product safety, and environmental requirements.

The Telcordia specifications comprise two sets of testing standards, GR-1089-CORE and GR-63-CORE. The tests in GR-1089-CORE deal primarily with electrical phenomena, whereas the tests in GR-63-CORE are predominantly environmental in nature. While each set of standards is quite extensive, typically only a subset of the tests are required based on the type of equipment and its intended operating environment. Together, these two sets of standards specify the electrical and environmental requirements that networking hardware must meet in order to be located in a telco building, e.g., the telco's central office (CO).

Besides the testing requirements, which are determined by product type, Telcordia has defined additional testing levels generally referred to in the telecom industry as Network Equipment Building Systems (NEBS) levels. The appropriate NEBS level for particular equipment is determined, again, by its intended operating environment and specific requirements of the Regional Bell Operating Companies (RBOCs). Generally, a higher NEBS level indicates a more stringent testing specification. NEBS testing verifies that telecom equipment can operate successfully under certain electrical and physical environmental stresses and not pose a safety hazard to personnel and users. These stresses and hazards include earthquakes, airborne contaminants, fire and smoke, electromagnetic interference (EMI), electrical safety, and grounding.

Requirements under the three NEBS levels may be summarized as follows: Level 1 includes: electrical safety; lighting and AC power fault ($2^{nd}$ level); bonding and grounding; emissions; and fire resistance; Level 2 includes: all of Level 1 in addition to—Electrostatic Discharge (ESD) under normal operation; emissions and immunity; lighting and AC power fault ($1^{st}$ level); ambient temperature and humidity (operating); earthquake Zone 2 and office vibration; and airborne contaminants (indoor level); Level 3 includes: all of Level 1 and Level 2 in addition to—ESD (installation and repair); open door emissions and immunity; ambient temperature and humidity (short-term); earthquake Zone 4; airborne contaminants (outdoor level); and transportation and handling. Each test within these three Levels is defined in either the GR-1089-CORE or GR-63-CORE documentation.

Testing of telecom interfaces, i.e., tip-and-ring (T and R or T/R) interfaces of the line cards utilized in telecom equipment and broadband coaxial cable interfaces, for lightning and AC power fault immunity in accordance with the above-referenced standards is necessary for several reasons. Power companies, Local Exchange Carriers (LECs) and broadband access providers often serve the same customers, and frequently employ joint-use facilities such as supporting structures or a common trench for their respective outside plant. Metallic conductors, such as cable or wire pairs serving telecom equipment may be exposed to electrical surges resulting from lightning and commercial power system disturbances. Despite the presence of protective devices in the telecommunications network that limit the effect of lightning and power surges, a portion of these disturbances can be impressed on the network equipment. Accordingly, under abnormal conditions, for instance, the power and telecommunications lines (including coax cables) may come into electrical contact. If the contact occurs to a primary power line, faults may be cleared quickly by the power system (5 seconds or less), and protectors (e.g., carbon blocks) can limit 60 Hz voltages appearing on the T and R conductors to maximum of approximately 600 VRMS with respect to ground. If the contact occurs to a secondary power line, the full secondary voltage with respect to ground (up to about 275 VRMS in some cases) may appear on the T and R conductors, which may persist indefinitely as the secondary fault may not be cleared by the power system.

Moreover, because electric power lines and telecom lines often occupy parallel routes as a result of a common right-of-way, the magnetic field produced by currents in a nearby power line, especially under abnormal conditions such as a phase-to-ground fault, may result in large voltages being induced into the telecom lines through electromagnetic coupling. The induced voltages appear longitudinally in the T and R conductors and may approach several hundred volts. Lower levels of induction may result from a high-impedance power fault such as a phase conductor falling to the earth. If the resulting unbalanced current is within the normal operating range of the power system, or if power system breakers or fuses do not operate, the fault may persist for an extended period of time.

Under the Telcordia's GR-1089-CORE standard, the lightning surge and AC power fault immunity criteria include compliance with various tests such as short-circuit tests (tip to ring, tip to ground with ring open-circuited, ring to ground with tip open-circuited, tip and ring to ground simultaneously, et cetera) and several AC power fault tests. As set forth hereinabove, these criteria are separated into $1^{st}$ level and $2^{nd}$ level criteria. To comply with the $1^{st}$ level criteria, it is required that the telecom Equipment Under Test (i.e., EUT) be undamaged and continue to operate properly after power stress is removed. To comply with the $2^{nd}$ level criteria, primary protectors are typically removed and high open-circuit voltages and high short-circuit currents are often applied for variable durations, ranging up to 15 to 30 minutes or so in some instances. The EUT may sustain damage, but it is required that the equipment not become a fire, fragmentation (that is, forceful ejection of fragments), or an electrical safety hazard.

While several lightning machines are available for conducting the lightning compliance tests required under the BellCore standards alluded to hereinabove, there is a paucity of appropriate AC power fault (PF) machines capable of sourcing power to telecom units under test for adequately conducting the AC power fault compliance tests, including the $2^{nd}$ Level tests. Further, the relatively few solutions extant today are beset with various shortcomings and drawbacks. First, the existing AC power fault machines are typically custom-designed to a large extent and, accordingly, incapable of accommodating various telecom equipment types and form factors. Additionally, these machines are quite expensive to manufacture owing at least in part to their custom design. In spite of the custom design, however, the existing PF machines are not capable of providing appropriate levels of test power safely to the EUT to conduct the whole range of $2^{nd}$ Level power failure tests as required under the relevant Sections of the GR-1089-CORE standard. Furthermore, although the conventional PF machines are fairly capacious because of the large size of the transformers typically required to provide adequate levels of test power, they are incapable of sourcing power to both two-wire T/R interfaces as well as broadband coax cable interfaces in the same physical plant. In addition, it would be desirable to support testing the EUT interfaces while the EUT is operating under power.

SUMMARY OF THE INVENTION

Accordingly, the present invention advantageously provides a safe, versatile and single-platform power fault (PF) testing apparatus that is capable of performing both voltage mode and current mode testing on line card T/R interfaces (two-wire interfaces) as well as broadband coaxial cable interfaces to Telcordia's $2^{nd}$ Level AC power fault standards. The power fault testing apparatus for testing telecommunications equipment interfaces includes a variable autotransformer unit coupled to a three-phase power source through a power relay. The variable autotransformer unit operates to provide a selectably switchable power output. A fixed transformer is selectably coupled to the power output of the variable autotransformer unit in order to provide selectably switchable power output to an interface of an Equipment Under Test (EUT) that is operable to be disposed in a test chamber. The power output of the fixed transformer is referenced to a single point ground, which may be building ground. The single point ground may be positioned at a relay bank. The power fault testing apparatus of the present invention further comprises a return path for the power output of the fixed transformer from the EUT to the single point ground of the fixed transformer. The return path, thereby referencing the EUT to the building ground, allows for testing the EUT interfaces while equipment is operating under power.

In one embodiment, the power fault testing apparatus of the present invention comprises a load resistor bank disposed between the fixed transformer and the EUT's tip-and-ring interface. The load resistor bank comprises a plurality of binary-coded resistors selectable by a series of relays coupled thereto. At least one relay operating under computer-based timer relay control may be disposed between the fixed transformer and the load resistor bank. Another relay operating under interface electronics control may be disposed between the variable autotransformer and the fixed transformer. A step transformer may be positioned between the variable autotransformer and the fixed transformer. The step transformer may be a 4:1 step down transformer. The variable autotransformer may be a 1:1.17 voltage boost transformer. The fixed transformer may be an isolation transformer.

In another embodiment of the present invention, at least one load resistor bank comprising individual (fixed) power resistors is disposed between the fixed transformer and the EUT's coaxial cable interface. A boost transformer is disposed between the variable transformer and the fixed transformer. At least one relay operating under interface electronics control is disposed between the variable autotransformer and the boost transformer.

Alternatively, a step down transformer is disposed between the variable transformer and the fixed transformer in a voltage bucking configuration. At least one relay operating under interface electronics control is disposed between the variable autotransformer and the step down transformer. In another embodiment, the output leads of the fixed transformer are applied directly to the test chamber.

In another aspect of the present invention, the power fault apparatus for testing telecommunications equipment interfaces includes a three phase 480 Vac, 600 A power service for sourcing power to the power fault testing apparatus. A plurality of transformers and load resistor banks are selectively and switchably coupled to the power service in a network organized as a plurality of power paths for interfacing to one of a tip-and-ring interface and a broadband coaxial cable interface of an equipment under test (EUT). A portion of the plurality of transformers are referenced to a single point ground that is also referenced to the EUT. A plurality of power relays interconnect the transformers and load resistor banks disposed in the network. A plurality of output relays are positioned for effectuating duration control output power applied to the tip-and-ring and broadband coaxial cable interfaces. The relays are referenced to a ground bar positioned at a Remote Control Station (RCS) to prevent voltage drops, through a common return, from adversely affecting unpowered relays.

Preferably, the EUT is placed in a testing chamber comprising a clear Plexiglas enclosure. Additionally, preferably, the testing chamber is provided with a safety interlocking mechanism. In a presently preferred embodiment, a RCS is associated with the test chamber.

BRIEF DESCRIPTION OF THE DRAWINGS

The accompanying drawings are incorporated into and form a part of the specification to illustrate the preferred embodiments of the present invention. Various advantages and features of the invention will be understood from the following Detailed Description taken in connection with the appended claims and with reference to the attached drawing figures in which:

DETAILED DESCRIPTION OF THE DRAWINGS

Figure 1:
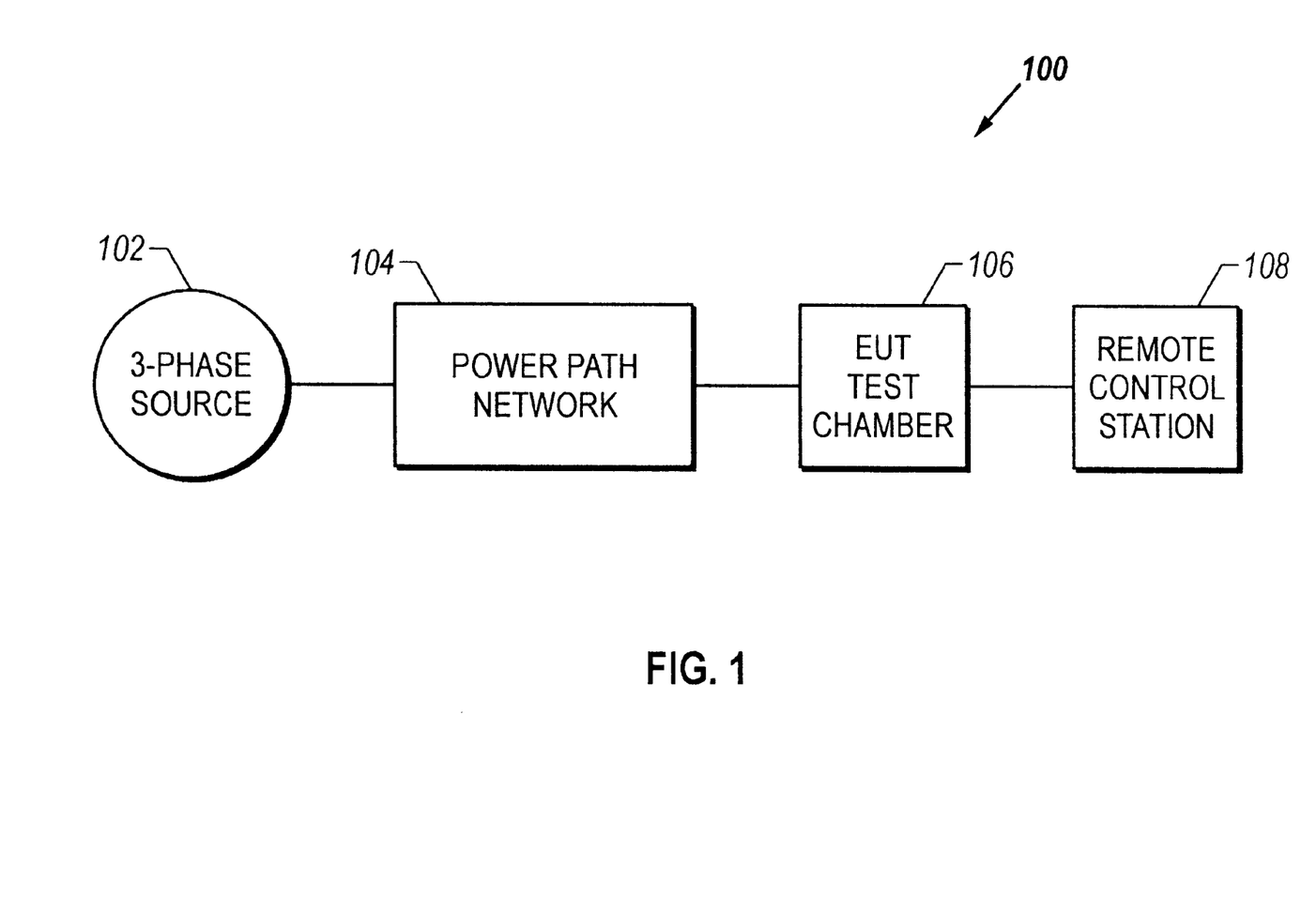
FIG. 1 depicts a functional block diagram of a presently preferred exemplary embodiment of a $2^{nd}$ Level AC power fault (PF) machine provided in accordance with the teachings of the present invention for testing T/R and broadband coaxial cable interfaces of an EUT.

In the drawings, like or similar elements are designated with identical reference numerals throughout the several views thereof, and the various elements depicted are not necessarily drawn to scale. Referring now to FIG. 1, depicted therein is a functional block diagram of a presently preferred exemplary embodiment of an AC power fault (PF) apparatus 100 provided in accordance with the teachings of the present invention for performing both voltage mode and current mode testing on telecommunications Equipment Under Test (EUT), e.g., two-wire T/R interfaces of the line cards and broadband coaxial cable interfaces, to Telcordia's AC power fault standards set forth in GR-1089-CORE, Section 4 (Issue 2, Rev. 1), which is incorporated by reference herein. More specifically, the PF apparatus or machine 100 provides an AC power source that is operable in accordance with the electrical conditions specified in Requirements R4-15, O4-17, R4-18, R4-34, R4-36, R4-41, and R4-44, and other parts of GR-1089-CORE relating to the criteria for equipment interfacing with coaxial cable ports (e.g., Section 4.6). Thus, the PF apparatus 100 may hereinafter be referred to as $2^{nd}$ Level PF machine for purposes of the present invention.

In the presently preferred exemplary embodiment of the present invention, the PF machine 100 operates from a three-phase 480 VAC, 600 A shore power service 102 that is commonly available for commercial and industrial installations. As will be set forth in greater detail hereinbelow, the source power is conditioned by a power path network 104 to obtain the required steady-state and transient output power. Essentially, a plurality of power paths are effectuated by a unique combination of transformers and load resistor banks that are interconnected to the three-phase power source 102 in a switchable and selectively actuatable manner so as to generate appropriate levels of current and voltage on each power path that is used to power the appropriate EUT's interface for compliance testing.

Output power from the power path network 104 is provided to the EUT disposed in a test chamber 106, wherein suitable AC power fault disturbances are applied to the EUT's interface with strict time duration control. The test chamber 106 is preferably comprised of a clear Plexiglass enclosure designed to protect test personnel from explosive debris, electrical and fire hazards, and smoke inhalation during the test.

Although not explicitly shown in FIG. 1, it should be appreciated by those skilled in the art that the test chamber 106 may be equipped with an exhaust fan duct to evacuate smoke, etc. Also, a plurality of access holes or apertures may be provided to allow instrumentation probe access, in addition to a set of main doors associated with the test chamber. The doors are preferably equipped with a safety interlock mechanism actuated at least in part by the position of the doors (i.e., open or closed).

Associated with the test chamber 106 is a remote control station (RCS) 108 which provides test personnel with a station wherein all parameters of the PF apparatus 100 may be remotely monitored and controlled. Preferably, RCS 108 is powered by an external control power source (e.g., 24 Vdc), wherein control power is distributed to the various components of the power path network 104 and interlock circuitry.

Figure 2:
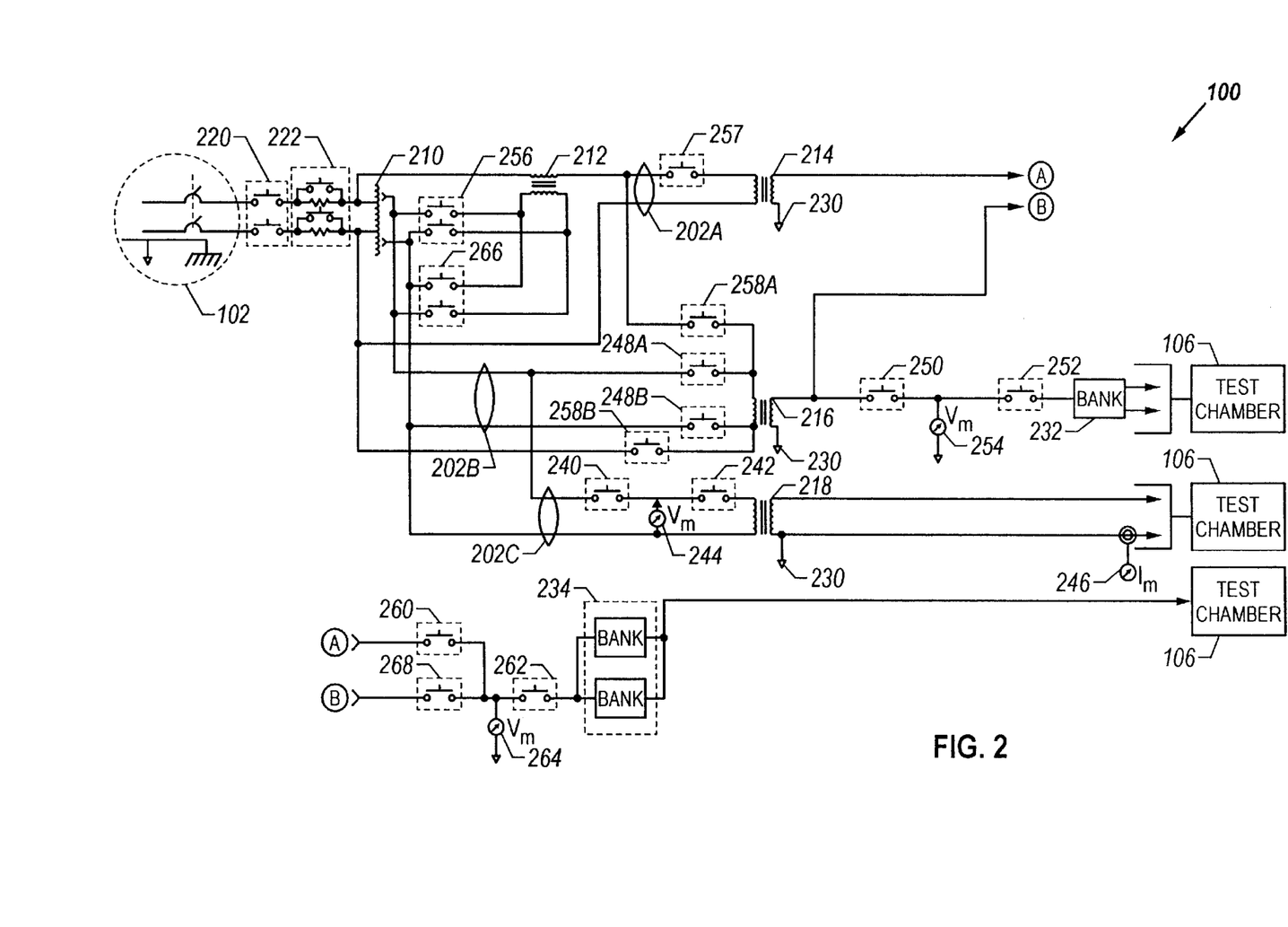
FIG. 2 depicts a schematic diagram of the power fault machine of the present invention.

Referring now to FIG. 2, depicted therein in particular detail is a schematic diagram of a presently preferred exemplary embodiment of the $2^{nd}$ level PF machine 100 provided in accordance with the teachings of the present invention. As alluded to in the foregoing, the PF machine is a device that sources a controlled AC power fault to the EUT positioned in the test chamber 106. The PF machine 100 is capable of performing all of the second level AC power fault tests called out in Telcordia GR-1089-CORE, section 4. Again as set forth hereinabove, system power is provided by the three-phase service 102 wherein only two of the three phases are used for sourcing power. The source power is conditioned by a plurality of power paths (e.g., power paths 202A, 202B, and 202C) formed from a combination of transformers, load resistor banks, and a relay bank (not illustrated) comprising multiple relays (illustrated) disposed in a selectively switchable network configuration.

As illustrated, the transformers include one variable autotransformer 210 and four fixed transformers 212, 214, 216 and 218. Preferably, each transformer is enclosed in an enclosure that satisfies the National Electrical Manufacturers Association (NEMA) Level I standards for cover enclosures for electrical equipment. Preferably, the power lines running to and from the transformers are encapsulated in a conduit.

The variable autotransformer 210 is equipped with a 120 Vac stepper motor (not shown) to control transformer wiper position, and hence, output voltage. Preferably, the 120 Vac power is obtained from a nearby 120 Vac outlet. The stepper motor input power is controlled by stepper motor power relays (not shown), which, when asserted, either increase or decrease the transformer output voltage. Stepper motor relay power is provided to the variable transformer by the RCS.

As previously mentioned, only two phases of the power source 102 are utilized for powering the PF machine 100. It should be appreciated that one of the two phases of the power source is operable in the PF machine 100 as a hot neutral or hot return. Power relays 220 and 222 are provided for selectively coupling the power source 102 to the motor driven, variable autotransformer unit 210 which provides a maximum output of 560 Vac at 120 A. Preferably, the power that is routed to the variable autotransformer 210 is routed through current limiting resistors that provide a delay. By providing a delay as little as approximately one second, the inrush of current is limited to manageable values while the inductive reactance of the transformers reaches a steady-state condition. The power output of the variable autotransformer 210 is operable to be selectably coupled to one of the multiple power paths of the PF machine 100 set forth herein.

The fixed transformers, transformers 214, 216, 218, which operate as isolation transformers, provide selectively switchable power output to an interface of the EUT. The power output of each fixed transformer 214, 216, 218 is referenced to a single point ground 230. Preferably, the single point ground 230 is referenced to a building ground. More preferably, the single point ground 230 is positioned at the relay bank. A return path is provided for the power output of each fixed transformer 214, 216, 218 from the EUT in the test chamber 106 to the single point ground 230 of the fixed transformer 214, 216, 218. Essentially, fault power current to the EUT originates from the hot side of the applicable isolation transformer and returns to the grounded side of the same transformer, preferably passing through the single point ground provided at the relay bank. The return path, thereby, references the EUT in the test chamber 106 to the building ground. Hence, the grounding method of the present invention eliminates the necessity for a unique return for each transformer. In addition, equipment can be safely tested while operating under power with test monitoring equipment attached.

A load resistor bank 232, described in further detail below, interfaces to a two-wire T/R interface of the EUT disposed in the test chamber 106 for effectuating different electrical conditions that are specified under the applicable requirements for conducting $2^{nd}$ Level AC power fault tests. Another load resistor bank 234, comprising one or more portions and described in further detail below, interfaces to a coaxial interface of the EUT for conducting applicable $2^{nd}$ Level AC power fault tests. As discussed above, the PF machine 100 is capable of performing various $2^{nd}$ level AC power fault tests relating to both the two-wire interfaces and broadband cable ports of telecom equipment. In one particular test, in a first transformer and relay configuration, a low voltage, high current power source is applied to the EUT chamber. In this test, the output of the variable autotransformer, preferably 480 Vac at 50 A, selectively powers fixed transformer 218 via a pair of power relays 240 and 242. Fixed transformer 218 is preferably a 20:1 step down transformer operable to provide an output of 24 Vac at 1000 A. As illustrated, a voltmeter 244 is positioned between relays 240 and 242 to provide system calibration. Likewise, an ammeter 246 is provided for monitoring the amperage so that the output of the variable autotransformer unit 210 can be suitably adjusted. In this transformer configuration, the output leads of the fixed transformer are applied directly to the EUT. Therefore, the power relays 240 and 242 are located on the input side of the fixed transformer. As illustrated, the first transformer and relay configuration provides a 1000 A test mode.

In a second transformer and relay configuration, the output from a selected transformer configuration is applied to the load resistor bank 232 for use in two-wire interface testing. In this configuration, the output of the variable autotransformer 210, preferably 560 Vac, selectively powers fixed transformer 216 via a pair of power relays 248A and 248B. Fixed transformer 216 is preferably an isolation transformer operable to provide output power of 560 Vac to load resistor bank 232 via power relays 250 and 252. A voltmeter 254 is disposed between power relays 250 and 252 to monitor the voltage so that the variable autotransformer unit 210 can be suitably adjusted. As illustrated, the second transformer and relay configuration supports a 0–560 Vac test mode.

In a third transformer and relay configuration, the output from a selected transformer configuration is likewise applied to the load resistor bank 232 for testing a two-wire interface in a higher AC voltage range. In this configuration, by selecting power relays 256, 258A, and 258B, the output of the variable autotransformer 210, preferably 560 Vac, selectively powers fixed transformer 212, a 4:1 step down transformer. Fixed transformer 212 adds 140 Vac to the 480 Vac input. The output of the step transformer 212, 620 Vac, in turn powers fixed transformer 216. Accordingly, the third transformer and relay configuration provides a 480–620 Vac test mode.

In a fourth transformer and relay configuration, a fixed voltage with a selectable current is applied to the EUT's coaxial interface. In this particular configuration, achieved by selecting power relays 256, 257, 260, and 262, the output of the variable autotransformer 210 powers fixed transformer 212 which in turn powers fixed transformer 214 to apply a power output to current load bank 234. Preferably, the variable autotransformer 210 is a 1:1.17 voltage boost transformer. The fixed transformer 212, preferably a 4:1 step down transformer, acts as a current boost transformer, in that a 480 Vac input 102 is boosted by 0–140 Vac, for a maximum output voltage of 620 Vac. The fixed transformer 214, preferably a 1:1.67 step up transformer, translates an input voltage of, for example, 600 Vac into 1000 Vac. A voltmeter 264 is positioned on the input side of power relay 262 to monitor the voltage input to the power relay whereby the output of the variable autotransformer unit 210 can be suitably adjusted. The power output of fixed transformer 214 is applied to load resistor bank 234. The output of load resistor bank 234 is thereby applied to the test chamber 106 via a coaxial interface. As illustrated, the fourth transformer and relay configuration supports a 1000 Vac test mode.

In a fifth transformer and relay configuration, yet another voltage test mode involving a fixed voltage with a selectable current output is provided for testing the EUT's coaxial cable interface. In this particular configuration, achieved by selecting power relays 266, 258A, 258B, 268, and 262, the power output of variable autotransformer 210, 560 Vac, is applied to fixed transformer 212 in a voltage bucking configuration. As discussed, fixed transformer 212 is preferably a 4:1 step down transformer. In this particular configuration, the power output of fixed transformer 212 is applied to fixed transformer 216, which is preferably, as previously discussed, an isolation transformer. Therefore, a 0–560 Vac input applied to the fixed transformer 212 provides a power output of 340–480 Vac to the fixed transformer 216. This power output, preferably 400 Vac, is then routed to the current load bank 234. As with the fourth transformer and relay configuration, a voltmeter 264 is positioned to calibrate the voltage of the variable autotransformer 210. As illustrated, the fifth transformer and relay configuration is operable to provide a 400 Vac test mode. It should be apparent to those skilled in the art that although specific voltages and transformer and relay configurations have been illustrated, other configurations that satisfy the aforementioned Telcordia specifications are within the teachings of the present invention.

Figure 3:
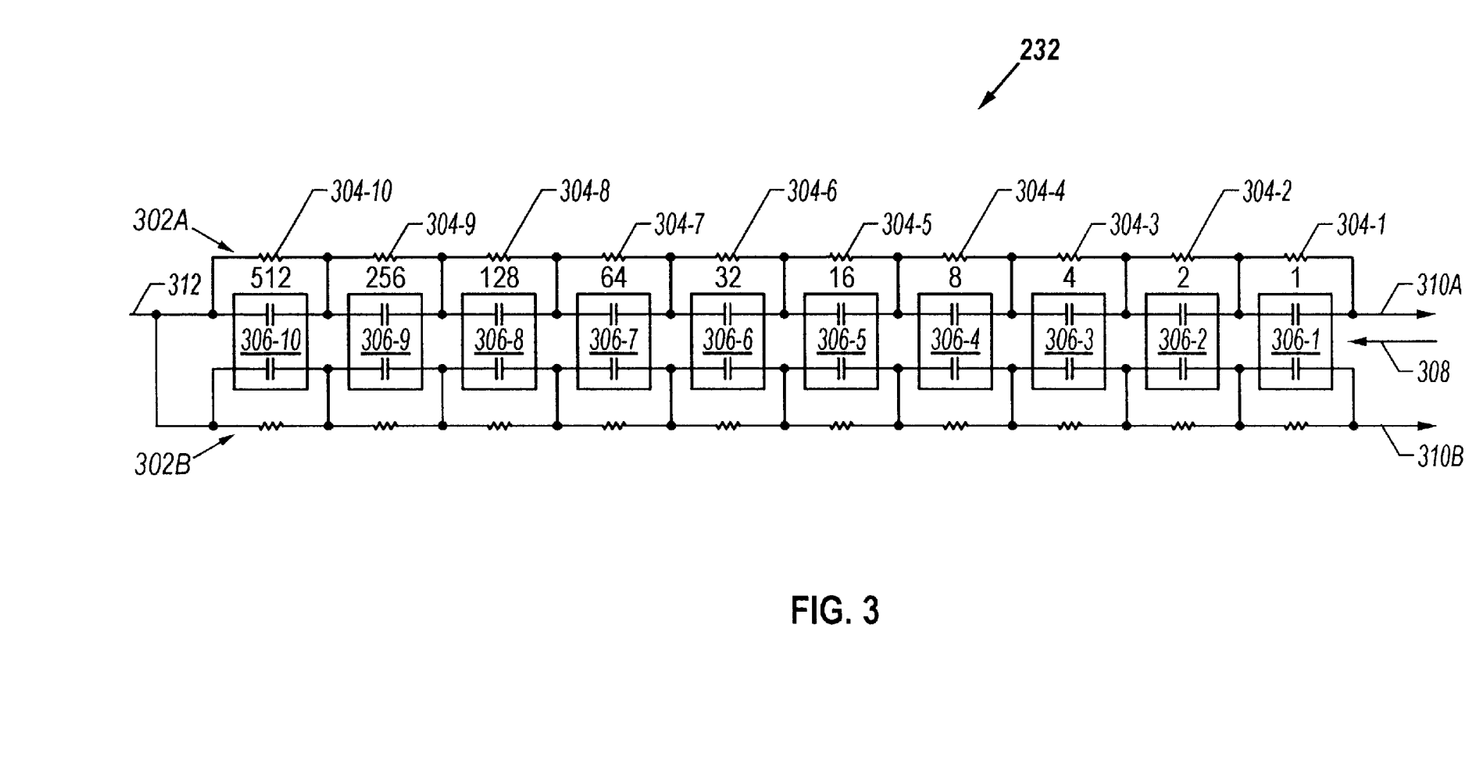
FIG. 3 depicts a schematic diagram of a presently preferred exemplary embodiment of a load resistor bank for use with the PF machine of the present invention.

FIG. 3 depicts a schematic diagram of a presently preferred exemplary embodiment of the load resistor bank 232 for use with the PF machine 100 in testing two-wire T/R interfaces. Power applied via path 312 from the time-controlled output relay 252 is provided to two resistor branches 302A, 302B, wherein each branch is organized as a series of resistors whose values are binary-coded. For example, 10 resistors. (reference numerals 304-1 through 304-10) are provided for the branch 302A and the resistance values begin with 1 ohm, and double up to a maximum of 512 ohms (i.e., 1, 2, 4, 8, 16, 32, et cetera).

Using the binary coding feature provided in accordance with the teachings of the present invention allows the operator to select 1023 different branch resistance values per branch by employing only 10 individual resistor values. The resistance value selection per branch is controlled by a plurality of relays (reference numerals 306-1 through 306-10) coupled to the resistors in a parallel arrangement. A particular individual resistor becomes active on a branch when a corresponding relay is open (i.e., de-asserted). Accordingly, for example, to obtain an equivalent resistance of 15 ohms on branch 302A or 302B, relays 306-10 through 306-5 are asserted which shunts the corresponding resistors.

In the presently preferred exemplary embodiment of the present invention, the resistor branches of the load resistor bank 232 are provided to be identical. The two branches interface to the two-wire T/R interface via paths 310A and 310B to the EUT disposed in the test chamber. A single control line 308, preferably emanating from the RCS, provides assertion power to the relays 306-1 through 306-10. In an exemplary embodiment, each relay may be equipped with a red indicator lamp which, when illuminated, indicates that the relay is closed (i.e., asserted). The resistor bank 232 is preferably enclosed in a smoke colored Plexiglass case which prohibits contact with, but allows viewing of, resistor bank components. Also, the doors of the case may be equipped with safety interlocks that determine door position. Interlock control logic provided in association with the RCS is operable to disable transformer power (by actuating appropriate power relays) if the resistor bank doors are open.

It should be apparent to one skilled in the art that instead of individual resistors whose values are binary-coded, resistor assemblies may be used in the load resistor bank 232 that have equivalent resistance values in a binary-coded fashion. Numerous resistor arrangements may therefore be had for providing an appropriate resistor bank for purposes of the present invention.

Figure 4:
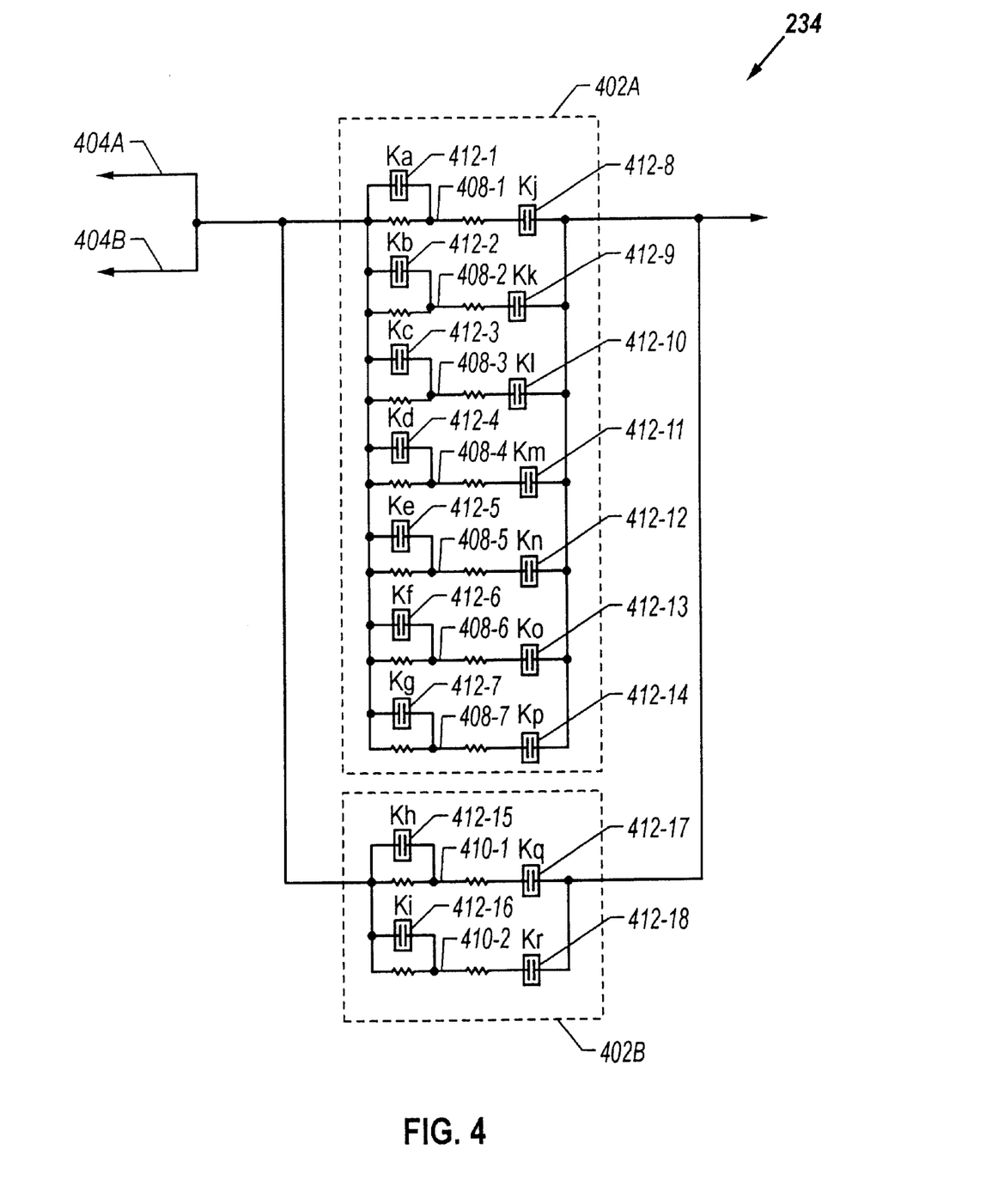
FIG. 4 depicts a schematic diagram of a presently preferred exemplary embodiment of another load resistor bank for use with the PF machine of the present invention for testing a coaxial cable interface.

Referring now to FIG. 4, depicted therein is a schematic diagram of a presently preferred exemplary embodiment of the load resistor bank 234 for use with the PF machine 100 of the present invention in testing a coaxial cable interface. Two power path segments 404A and 404B are provided for selectably switchable coupling with the power path network of the PF apparatus by means of power relay 260 (for sourcing 1000 V at 350 A) and power relay 268 (for sourcing 400 V at 350 A), respectively. Coaxial power interface is provided to the EUT through two resistive bank portions 402A and 402B, each comprising a plurality of individual (fixed) power resistors configured to operate as a plurality of current paths having predetermined current steps (e.g., 2 A intervals). Selected output current is provided via path 406 coupled to the timer-controlled output relay 262 in order to apply to the EUT for appropriate time durations (e.g., 3 min., 6 min., et cetera).

The load resistor bank 234 is provided as two segregated resistive bank portions 402A and 402B. Both bank portions comprise one or more current paths, each of which is formed based on one or more load segments comprising a resistor/relay assembly. For example, seven load segments (reference numerals 408-1 through 408-7) are operable to provide a plurality of standard current paths with respect to bank portion 402A. In similar fashion, two load segments 410-1 and 410-2 are exemplified for bank portion 402B for effectuating a plurality of high current paths.

Each power resistor on a path is tapped and a portion of the resistor is switched into or out of the current path, depending on the applied voltage and the required current, by a pair of relays disposed thereon. Accordingly, a total of 18 relays Ka through Kr (reference numerals 412-1 through 412-18) are provided in the exemplary load resistor bank 234. Assertion control for these relays is provided through a plurality of switches preferably provided as part of the RCS 108 of the PF machine 100.

Figure 5:
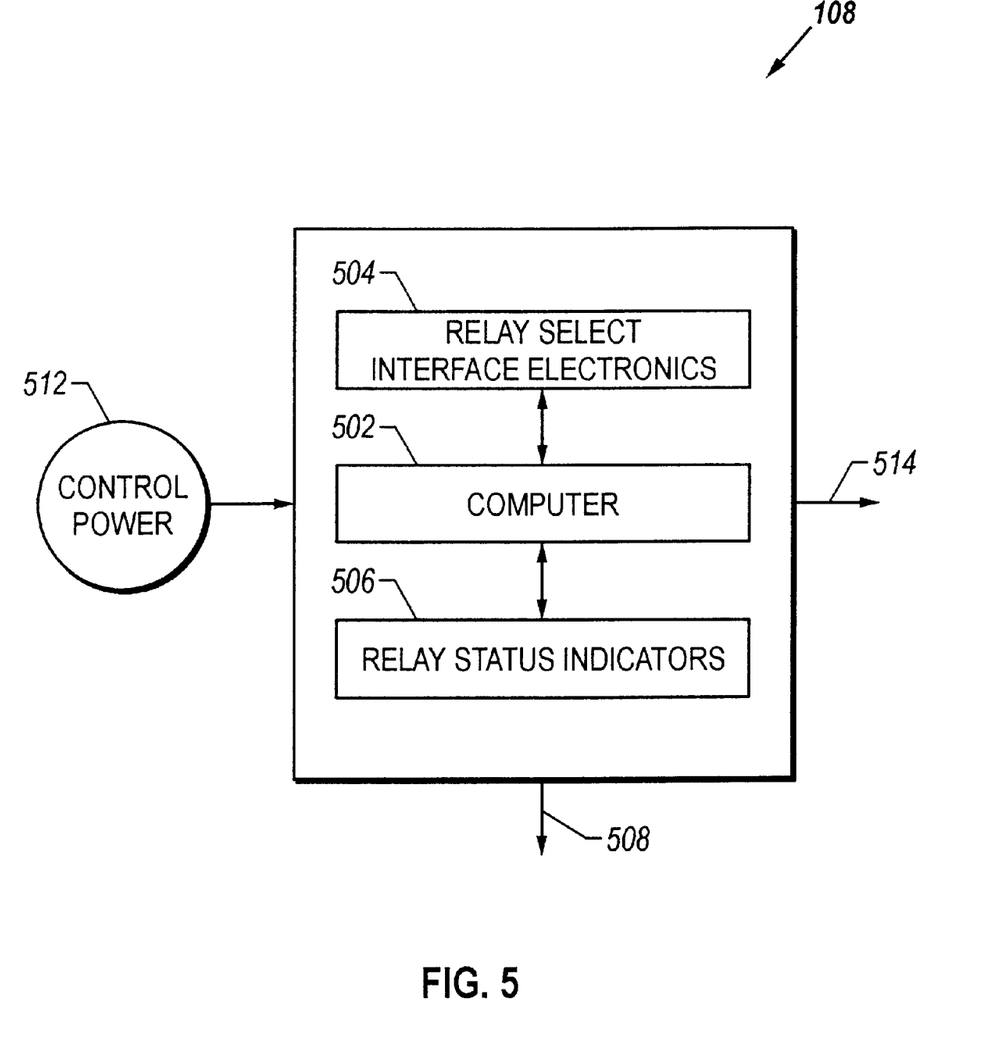
FIG. 5 depicts a schematic diagram of a remote control station of the present invention.

Referring now to FIG. 5, a schematic diagram of the RCS 108 of the present invention is depicted. The RCS 108 provides test personnel with a station, wherein all parameters of the PF machine 100 may be controlled. The RCS 108 is used to set the transformer configuration, select resistance values, and command load power. The RCS 108 comprises a computer 502, relay select interface electronics 504, relay status indicators 506, and a ground bar 508. In a presently preferred exemplary embodiment, the RCS 108 receives power from an external 24 Vdc, 40 A power source 512. The RCS 108 distributes control power 514 to the interlock circuitry and the PF machine 100 including the load resistor bank relays, the variable transformer stepper motor control relays, and the resistor load bank cooling fan relays.

The computer 502 provides computer based timed relay control for the time power that is supplied to the EUT test chamber. The computer 502 provides a clock function that acts as a timing program to select the proper test time for a particular transformer and relay configuration. When the proper test time is selected, the computer 502 sends a timing pulse signal to close the applicable relay so that power may be applied to the EUT for specific times.

The relay select interface electronics 504 provide a means for an operator to select between the operating states of the PF machine 100. For example, the relay select interface electronics 504 allow an operator to choose between the five transformer configurations presented hereinabove that include the 1000 A test mode, 1000 Vac test mode, 400 Vac test mode, 480–620 Vac test mode, and the 0–560 Vac test mode. The relay status indicators 506 provide an indication of the operation of each relay 208.

Furthermore, the interface electronics 504 control the safety features of the PF machine 100 such as the interlock circuitry. The interlock circuitry prevents the unsafe application of power to the resistor banks and the EUT load chamber. The interlock circuitry is also designed to prevent unallowable states (e.g., two transformer outputs tied together). To prevent the unsafe application of power, the interlock circuitry communicates with interlock switches located on the doors of the EUT test chamber 106, the load resistor banks 232, 234, and various relays. Additionally, the interlock circuitry monitors various safety switches that are integrated into the system such as a voltage OFF switch, emergency OFF switch, and system power OFF switch.

The interlock circuitry will cease providing power to the PF machine, if, for example, any of the following conditions are true:

EUT chamber door open;
Load resistor bank 232 door open;
Safety switch asserted; or
External timer circuit opens.

Each power return from relays 220, 222, 240, 242, 248A and B, 250, 252, 256, 257, 258A and B, 260, 262, 266, and 268 and power source 512 reference the ground bar 508. This grounding method of the present invention prevents voltage drops, through a common return, from adversely affecting unpowered relays. In addition, equipment can be safely tested while operating under power with test monitoring equipment attached. Although the RCS 108 has been presented as a functional block diagram, it should be apparent to one skilled in the art that the RCS 108 may comprise any combination of hardware or software.

Figure 6:
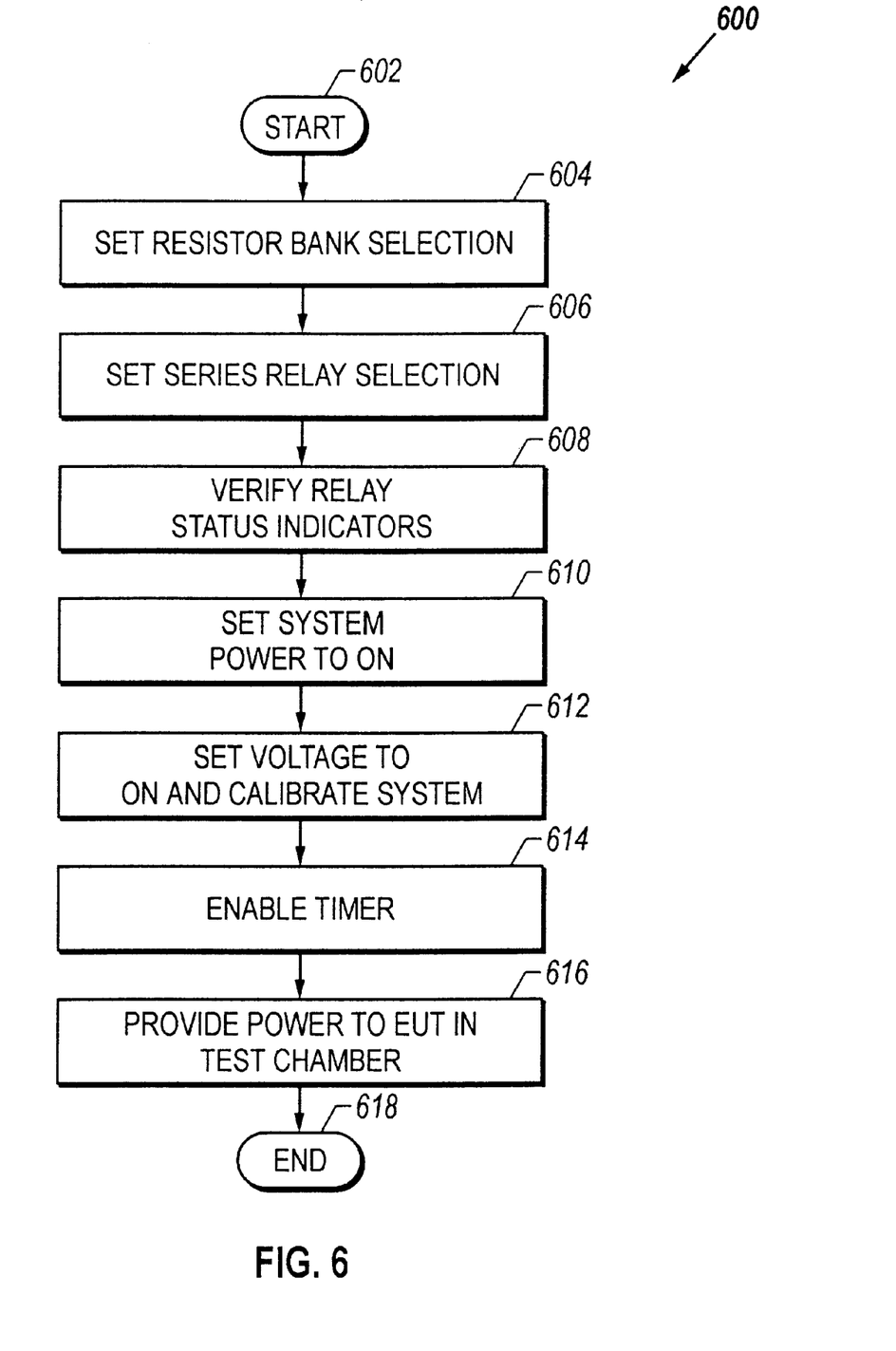
FIG. 6 depicts a flow chart of a presently preferred exemplary operation of the PF machine of the present invention.

Referring now to FIG. 6, wherein a presently preferred exemplary operation of the PF machine 100 of the present invention is depicted in flow chart 600. The method begins at step 602. At step 604, an applicable resistor bank is selected. For example, in the 480–620 Vac test mode, load resistor bank 232 is selected. In the 1000 A test mode, no load resistor bank is selected.

The appropriate series of output relays 208 are selected at step 606. For example, in the 480–620 Vac test mode, output relays 220, 222, 256, 258A, 258B, 250, and 252 are selected. In the 1000 A test mode, output relays 220, 222, 240, and 242 are selected.

The power route is verified by checking the relay status indicators 506 (step 608). For example, in the 480–620 Vac test mode, the relay status indicators 506 for output relays 220, 222, 256, 258A, 258B should verify power distribution. In the 1000 A test mode, the relay status indicators 506 for output relays 220 and 222 should verify power distribution.

At step 610, system power is set to ON. At step 612, the voltage is set to ON and the voltage is calibrated, if necessary. Continuing with the illustrated test scenarios, in the 480–620 Vac test mode, relay 250 is closed. The voltage is measured by voltmeter 254 and appropriate calibration is performed. In the 1000 A test mode, relay 240 is closed and the voltage is measured by voltmeter 244. Appropriate calibration is performed accordingly.

At step 614, the appropriate test time is selected. At step 616, power is provided to the test chamber 106 and the test is conducted. In the 480–620 Vac test mode, the relays status indicator 506 for output relay 252 should verify that output power is being applied to the test chamber 106. In the 1000 A test mode, relay 240 is closed and the status indicator for output relay 242 should verify output power is being applied to the test chamber 106. The output power that is being applied to the test chamber forms a return path with the fixed transformer that applied the output power. For example, in the 480–620 Vac test mode, the output power applied to the EUT in the test chamber 106 forms a return path with fixed transformer 216. This references the EUT in the test chamber to the single point ground 230. Likewise, for the 1000 A test mode, a return output power path is formed between the EUT in test chamber 106 and fixed transformer 218, thereby referencing the EUT to the single point ground 230. This grounding method eliminates the need for separate returns for each transformer.

Additionally, each power return from relays 220, 222, 240, 242, 248A and B, 250, 252, 256, 257, 258A and B, 260, 262, 266, and 268 and power source 512 references the ground bar 508 at RCS 108. This grounding method of the present invention prevents voltage drops, through a common return, from adversely affecting unpowered relays. For example, in the 480–620 Vac test mode, a voltage drop across relay 252 should not affect relay 242. Similarly, in the 1000 A test mode, a voltage drop across relay 242 should not affect relay 252.

At step 618, the test is completed. Although flow chart 600 has been described with illustrative examples of the 480–620 Vac test mode and 1000 A test mode, it should be understood by one skilled in the art that the exemplary method illustrated in flow chart 600 is applicable to other test modes including the 0–560 Vac test mode, fixed 400 Vac test mode, and fixed 1000 Vac test mode.

Based upon the foregoing Detailed Description, it should be readily apparent that the present invention provides an innovative AC power source solution that complies with the existing standards for $2^{nd}$ Level power fault testing of telecom equipment without the shortcomings and deficiencies of the conventional AC power fault machines set forth in the Background section of the present patent application. The versatile design of the PF machine provided in accordance with the teachings of the present invention is advantageously capable of sourcing power to both two-wire interfaces as well as broadband cable interfaces within one platform. In one embodiment, by connecting a current boost transformer to the output of a variable autotransformer, source current is increased by a factor of 4, thereby allowing the current ranges required under the applicable Telcordia standards for performing $2^{nd}$ Level AC disturbance tests. It should be appreciated that by using the current boosting technique, a much smaller autotransformer can be used in the PF machine's design, thereby saving cost and reducing overall size. Additionally, by including over-current transformers (e.g., first and third fixed transformers), an over-current condition of 125% for about 3 minutes may be achieved in order to comply with certain requirements in the same machine.

Furthermore, the present invention allows the use of the same or substantially the same components for a variety of tasks. For instance, by utilizing the binary coding feature of the present invention, a small number of resistor values may be advantageously assembled to provide a large number of branch resistance values for providing a significant range of test power. Also, individual components can be selectively optimized based on their function within the PF machine. For example, the various relays used for effectuating the selectably switchable power paths can be comprised of an assortment of available relays. Relays not used for load switching are designed to make and conduct, but not break, load current at the specified voltage level (i.e., lower cost components) Relays used to interconnect transformers and relays used to control the load are specified to make, conduct, and break load current. Accordingly, by utilizing a mixture of off-the-shelf and custom designed components to meet the necessary full-range AC requirements, overall form factor as well as manufacturability can be advantageously optimized.

Additionally, by referencing each fixed transformer to a single point ground and by providing a return path for the output power of each fixed transformer, the EUT in the test chamber is referenced to a single point ground. As set forth above, this grounding scheme advantageously allows for testing the EUT interfaces while the equipment is operating under power.

Further, it is believed that the operation and construction of the present invention will be apparent from the foregoing Detailed Description. While the apparatus shown and described has been characterized as being preferred, it should be readily understood that various changes and modifications could be made therein without departing from the scope of the present invention as set forth in the following claims.

What is claimed is:

1. A power fault testing apparatus for testing telecommunications equipment interfaces, comprising:
   a variable autotransformer unit coupled to a three-phase power source through a power relay, said variable autotransformer unit operating to provide a selectably switchable power output; and
   a fixed transformer selectably coupled to said power output of said variable autotransformer unit, said fixed transformer operating to provide selectably switchable power output to an interface of an Equipment Under Test (EUT) operable to be disposed in a test chamber, wherein said power output of said fixed transformer is referenced to a single point ground that is also referenced to said EUT.

2. The power fault testing apparatus for testing telecommunications equipment interfaces as set forth in claim 1, wherein said single point ground is tied to a building ground.

3. The power fault testing apparatus for testing telecommunications equipment interfaces as set forth in claim 2, wherein said single point ground is positioned at a relay bank.

4. The power fault testing apparatus for testing telecommunications equipment interfaces as set forth in claim 3, further comprising a load resistor bank disposed between said fixed transformer and said test chamber, wherein said load resistor bank interfaces with said EUT's tip-and-ring interface.

5. The power fault testing apparatus for testing telecommunications equipment interfaces as set forth in claim 4, wherein said load resistor bank comprises a plurality of binary-coded resistors selectable by a series of relays coupled thereto.

6. The power fault testing apparatus for testing telecommunications equipment as set forth in claim 4, further comprising at least one relay disposed between said fixed transformer and said load resistor bank, said at least one relay operating under computer-based timer relay control.

7. The power fault testing apparatus for testing telecommunications equipment as set forth in claim 4, further comprising at least one relay disposed between said fixed transformer and said variable autotransformer, said at least one relay operating under interface electronics control.

8. The power fault testing apparatus for testing telecommunications equipment interfaces as set forth in claim 4, further comprising a step transformer disposed between said variable autotransformer and said fixed transformer, said step transformer coupled to said power output of said variable autotransformer unit in a current boost configuration, wherein said step transformer provides a power output to said fixed transformer.

9. The power fault testing apparatus for testing telecommunications equipment interfaces as set forth in claim 8, wherein said step transformer is a 4:1 step down transformer.

10. The power fault testing apparatus for testing telecommunications equipment interfaces as set forth in claim 8, wherein said variable autotransformer is a 1:1.17 voltage boost transformer.

11. The power fault testing apparatus for testing telecommunications equipment interfaces as set forth in claim 4, wherein said fixed transformer is operable as an isolation transformer.

12. The power fault testing apparatus for testing telecommunications equipment interfaces as set forth in claim 3, further comprising at least one load resistor bank disposed between said fixed transformer and said test chamber, wherein said at least one load resistor bank interfaces with said EUT's coaxial cable interface.

13. The power fault testing apparatus for testing telecommunications equipment interfaces as set forth in claim 12, wherein said at least one load resistor bank is comprised of a plurality of segments operable to effectuate at least one current path with a predetermined current step per path, and further wherein individual resistors disposed on said resistor segments are selectively activatable by a plurality of relays coupled thereto.

14. The power fault testing apparatus for testing telecommunications equipment interfaces as set forth in claim 12, further comprising at least one relay disposed between said fixed transformer and said at least one load resistor bank, said at least one relay operating under computer-based timer relay control.

15. The power fault testing apparatus for testing telecommunications equipment interfaces as set forth in claim 12, further comprising a boost transformer disposed between said variable transformer and said fixed transformer, said boost transformer coupled to said power output of said variable autotransformer unit in a current boost configuration, wherein said boost transformer provides a power output to said fixed transformer.

16. The power fault testing apparatus for testing telecommunications equipment as set forth in claim 15, further comprising at least one relay disposed between said variable autotransformer and said boost transformer, said at least one relay operating under interface electronics control.

17. The power fault testing apparatus for testing telecommunications equipment as set forth in claim 15, further comprising at least one relay disposed between said boost autotransformer and said fixed transformer, said at least one relay operating under interface electronics control.

18. A power fault testing apparatus for testing telecommunications equipment interfaces, comprising:

a three-phase 480 Vac, 600 A power service for sourcing power to said power fault testing apparatus;

a plurality of transformers and load resistor banks selectively and switchably coupled to said power service in a network organized as a plurality of power paths for interfacing to one of a tip-and-ring interface and a broadband coaxial cable interface of an equipment under test (EUT);

a portion of said plurality of transformers are referenced to a single point ground that is also referenced to said EUT;

a plurality of power relays for interconnecting said transformers and said load resistor banks disposed in said network; and a plurality of output relays for effectuating duration control of output power applied to said tip-and-ring and broadband coaxial cable interfaces.

19. The power fault testing apparatus for testing telecommunications equipment interfaces as set forth in claim 18, wherein said plurality of output relays are controlled by a computer-based timer relay control mechanism.

20. The power fault testing apparatus for testing telecommunications equipment interfaces as set forth in claim 19, wherein said EUT is placed in a testing chamber comprised of a clear Plexiglass enclosure.

21. The power fault testing apparatus for testing telecommunications interfaces as set forth in claim 20, wherein said testing chamber is provided with a safety interlocking mechanism.

22. The power fault testing apparatus for testing telecommunications interfaces as set forth in claim 20, further including a remote control station associated with said test chamber.

23. The power fault testing apparatus for testing telecommunications interfaces as set forth in claim 20, wherein said plurality of load resistor banks comprises a binary-coded resistor bank.

24. The power fault testing apparatus for testing telecommunications interfaces as set forth in claim 20, wherein said plurality of load resistor banks comprises a power resistor bank operable to effectuate one or more current paths with a predetermined current step per path.

25. A power fault testing apparatus for testing telecommunications equipment interfaces, comprising:

a three-phase 480 Vac, 600 A power service for sourcing power to said power fault testing apparatus;

a plurality of transformers and load resistor banks selectively and switchably coupled to said power service in a network organized as a plurality of power paths for interfacing to one of a tip-and-ring interface and a broadband coaxial cable interface of an equipment under test (EUT);

a plurality of power relays for interconnecting said transformers and said load resistor banks disposed in said network;

wherein each power relay is coupled to a ground bar positioned at a relay control station, thereby preventing voltage drops, through a common return, from adversely affecting unpowered relays; and a plurality of output relays for effectuating duration control of output power applied to said tip-and-ring and broadband coaxial cable interfaces.

26. The power fault testing apparatus for testing telecommunications equipment interfaces as set forth in claim 25, wherein said plurality of output relays are controlled by a computer-based timer relay control mechanism.

27. The power fault testing apparatus for testing telecommunications equipment interfaces as set forth in claim 26, wherein said EUT is placed in a testing chamber comprised of a clear Plexiglass enclosure.

28. The power fault testing apparatus for testing telecommunications interfaces as set forth in claim 27, wherein said testing chamber is provided with a safety interlocking mechanism.

29. The power fault testing apparatus for testing telecommunications interfaces as set forth in claim 27, further including a remote control station associated with said test chamber.

30. The power fault testing apparatus for testing telecommunications interfaces as set forth in claim 27, wherein said plurality of load resistor banks comprises a binary-coded resistor bank.

31. The power fault testing apparatus for testing telecommunications interfaces as set forth in claim 27, wherein said plurality of load resistor banks comprises a power resistor bank operable to effectuate one or more current paths with a predetermined current step per path.

\* \* \* \* \*